United States Patent [19]

Anand et al.

[11] Patent Number: 5,329,151

[45] Date of Patent: Jul. 12, 1994

[54] SEMICONDUCTOR DIODE

[75] Inventors: Yoginder Anand, Chelmsford, Mass.; Roger J. Malik, Warren, N.J.

[73] Assignee: AT&T Bell Laboratories, Murray Hill, N.J.

[21] Appl. No.: 45,849

[22] Filed: Apr. 9, 1993

[51] Int. Cl.$^5$ .................. H01L 29/167; H01L 29/207; H01L 29/227

[52] U.S. Cl. .................... 257/498; 257/607; 257/608; 257/609

[58] Field of Search .............. 257/498, 607, 608, 609, 257/197

[56] References Cited

U.S. PATENT DOCUMENTS

| | | | |
|---|---|---|---|
| 4,149,174 | 4/1979 | Shannon | 357/13 |
| 4,410,902 | 10/1983 | Malik | 357/13 |
| 4,839,709 | 6/1989 | Zurakowski | 357/30 |
| 5,001,534 | 3/1991 | Lunardi et al. | 257/197 |
| 5,106,766 | 4/1992 | Malik | 437/31 |

FOREIGN PATENT DOCUMENTS 2221091A 1/1990 United Kingdom .

OTHER PUBLICATIONS

"GaAs Planar Doped Barrier Diodes for Mixer and Detector Applications", by M. J. Kearney et al., GEC Journal of Research, vol. 8, No. 1, 1990, pp. 1–12.

"AlGaAs/GaAs Heterojunction Bipolar Transistors with Heavily C-doped Base Layers Grown by Flow-rate Modulation Epitaxy", T. Makimoto et al., Applied Physics Letters, vol. 54, No. 1, Jan. 2, 1888, pp. 39–41.

"Reliability Characteristics of Mesa-etched Isolated Emitter Structure AlGaAs/GaAs HBTs with Be-doped Base", by N. Nozu et al., 1992 IEEE GaAs IC Symposium, pp. 157–160.

"Chemical Beam Epitaxial Growth of Strained Carbon-doped GaAs", by T. H. Chiu et al., Applied Physics Letters, vol. 57, No. 2, Jul. 9, 1990, pp. 171–173.

"Incorporation of Carbon in Heavily Doped $Al_x Ga_{1-x} As$ Grown by Metalorganic Molecular Beam Epitaxy", by C. R. Abernathy et al., Applied Physics Letters, vol. 57, No. 3, Jul. 16, 1990, pp. 294–296.

"Carbon Doping in Molecular Beam Epitaxy of GaAs from a Heated Graphite Filament", by R. J. Malik et al., Applied Physics Letters, vol. 53, No. 26, Dec. 26, 1988.

"Reliability Comparison of Beryllium Versus Carbon for GaAs Planar Doped Barrier Diodes", by Y. Anand et al., Proc. IEEE GaAs Reliability Workshop, Miami Beach, Fla., Oct. 14, 1992.

"Properties and Applications of Carbon-Doped GaAs and $Al_x Ga_{1-x} As$ Layers Grown by MBE with a Pyrolytic Graphite Filament", by R. J. Malik et al., 7th International Conference on Molecular Beam Epitaxy, Schwabisch Gmund, Germany, Aug. 24–28, 1992.

Primary Examiner—Sara W. Crane
Attorney, Agent, or Firm—E. E. Pacher

[57] ABSTRACT

The disclosed improved GaAs majority carrier rectifying barrier diodes comprise a $p^+$ region between semiconductor regions that comprise n-doped material. Exemplary structures are $n^+$-i-$p^+$-i-$n^+$ and $n^+$-n-$p^+$-n-$n^+$. The improvement comprises use of carbon as the p-dopant and results in readily manufacturable reliable devices.

10 Claims, 1 Drawing Sheet

SEMICONDUCTOR DIODE

FIELD OF THE INVENTION

This invention pertains to semiconductor diodes. More particularly, it pertains to majority carrier rectifying barrier diodes, exemplarily such diodes embodied in III-V semiconductor material such as GaAs.

BACKGROUND OF THE INVENTION

Majority carrier rectifying barrier diodes are known. Among them are the so-called planar doped barrier (PDB) diodes. See, for instance, U.S. Pat. No. 4,410,902, which discloses a semiconductor diode comprising a $n^+$-i-$p^+$-i-$n^+$ layer structure, with the $p^+$ layer being very thin. Modifications of the structure of the '902 patent are also known. See, for instance, British patent application GB 2,221,091A, which discloses a semiconductor diode having a $n^+$-n-i-$p^+$-i-n-$n^+$ layer structure, with the two n-layers differing in their dopant concentration and, optionally, in their thickness. The '091A application also discloses that the i-layers can be lightly n-doped in order to reduce device resistance, and that either, but not both, of the i-layers could be omitted. See also U.S. Pat. No. 4,839,709, which discloses a diode having n-p-i-n layer structure, and U.S. Pat. No. 4,149,174, which discloses a diode having a $n^+$-p-n layer structure. In all these exemplary diodes the thickness of the acceptor-doped region is selected such that the region is substantially depleted of holes.

PDB diodes (including all modifications of the diode of the '902 patent; we will refer to these devices collectively as "PDB" diodes) generally have advantageous characteristics that make them attractive for microwave applications, e.g., microwave mixers or detectors. These diodes typically comprise III-V semiconductor material (typically GaAs), with Be being the acceptor dopant species. See, for instance, M. J. Kearney et al, *GEC Journal of Research*, Vol. 8(1), p. 1, 1990.

Although prior art PDB diodes have many advantageous features, it has to date proven difficult to manufacture these devices with high yield, and we are unaware of any suggestions in the prior art regarding the source of, or a solution to, this problem. In view of the commercial potential of PDB diodes, it would be highly desirable to have available a design that can more readily and reliably be manufactured to meet typical design specifications. This application discloses such a design.

The p-dopant in n-p-n AlGaAs/GaAs heterojunctive bipolar transistors (HBTs) has conventionally been Be. Recently, it has been disclosed that carbon is a promising p-dopant for these HBTs, due at least in part to the relatively small diffusion coefficient of carbon in GaAs. See, for instance, T. Makimoto et al., *Applied Physics Letters*, Vol. 54(1), p. 39. However, T. Nozu et al., *Proceedings of the GaAs IC Symposium*, Miami Beach, Fla., Oct. 5-7, 1992, p. 157, discloses that no serious Be diffusion occurs in AlGaAs/GaAs HBTs with Be-doped base, provided the growth temperature is below 620° C. All the above cited references are incorporated herein by reference.

Carbon-doped GaAs has been produced by a variety of growth techniques, including chemical beam epitaxy (see, for instance, T. H. Chiu et al., *Applied Physics Letters*, Vol. 57(2), p. 171), metalorganic molecular beam epitaxy (e.g., C. R. Abernathy et al., *Applied Physics Letters*, Vol. 57(3), p. 294) and molecular beam epitaxy (e.g., R. J. Malik et al., *Applied Physics Letters*, Vol. 53(26), p. 2661. The latter paper discloses an advantageous doping technique, namely, carbon sublimation from a heated graphite filament. See also U.S. Pat. No. 5,106,766.

THE INVENTION

Figure 1:
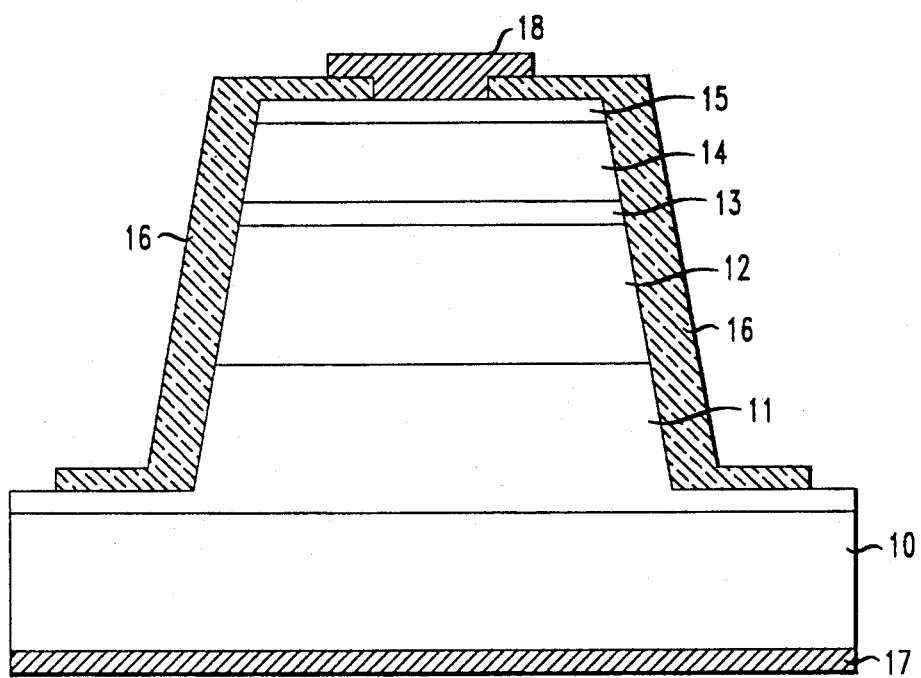
FIG. 1 schematically depicts an exemplary embodiment of the invention.

We have made the unexpected discovery that substitution of carbon (C) for beryllium (Be) as the acceptor species in GaAs PDB diodes can result in improved manufacturability and device yield, even for devices grown at temperatures below 620° C. We consider this to be a surprising result, especially in light of the teaching of T. Nozu et al. (op. cit) that "... no serious Be-diffusion occurs at growth temperatures below 620° C." in $Al_xGa_{1-x}As$ (x=0-0.1; see Table 1 of the reference).

In a broad aspect the invention thus is embodied in an improved GaAs-based PDB diode. More specifically, the invention is embodied in a GaAs-based semiconductor diode which comprises first and second substantially planar semiconductor regions, with a p-doped planar semiconductor region of thickness t between said first and second regions. The diode further comprises means for electrically contacting said first and second semiconductor regions such that an electrical bias can be applied between the first and second regions. Each of said first and second regions comprises n-doped semiconductor material. The thickness t is selected such that, at room temperature and zero applied bias, said p-doped semiconductor region is substantially depleted of holes. Significantly, the dopant in the p-doped region substantially is carbon, typically at least $10^{18}$ cm$^{-3}$ carbon. Typically, carbon is essentially the only acceptor species in the p-doped region, and t typically is in the range 0.3-30 nm.

In a particular embodiment, each of the first and second regions comprises a substantially undoped (designated "i"; exemplarily $\lesssim 10^{15}$/cm$^3$ dopant concentration) semiconductor region in contact with the p-doped region, in a layer structure substantially as shown in the '902 patent. Exemplarily, this embodiment can find advantageous use as a microwave detector diode.

In another particular embodiment, each of the first and second regions comprises a lightly n-doped (designated "n"; exemplarily $0.1-1 \times 10^{17}$/cm$^3$ donor concentration) semiconductor region in contact with the p-doped region. Exemplarily, this embodiment can advantageously find use as a microwave mixer diode.

Indeed, the invention can be embodied in any variation of the basic PDB design, and all these embodiments are contemplated. FIG. 1 schematically shows an exemplary PDB diode, wherein reference numerals 11-15 refer, respectively, to the first $n^+$, first intrinsic (thickness $d_1$), $p^+$, second intrinsic (thickness $d_2$), and second $n^+$ epitaxial layers, and 10 refers to the (typically $n^+$) substrate. Exemplarily, layers 10-15 are GaAs. Layers 17 and 18 are metal layers, e.g., Au-Ge-Ni-Au. Numeral 16 refers to optional encapsulant, exemplarily $SiN_x$. Exemplarily, the first $n^+$ layer is doped to $1-5 \times 10^{18}$ cm$^{-3}$, $d_1$ is the range 0.01-1.0 μm, the $p^+$ layer has thickness 1-10 nm and doping $1-5 \times 10^{18}$ cm$^{-3}$, $d_2$ is in the range 0.01-1.0 μm, and the second $n^+$ layer is doped to $1-5 \times 10^{18}$ cm$^{-3}$.

As disclosed above, in diodes according to the invention the thin p+ layer is not necessarily in contact with two intrinsic (not intentionally doped, $\lesssim 10^{15}$ cm$^{-3}$) layers. In some embodiments of the invention, the p+ layer is in contact with a relatively lightly n-doped (e.g., $0.1-1 \times 10^{17}$ cm$^{-3}$) layer and with an intrinsic layer, or it is in contact with two relatively lightly n-doped layers. In still other embodiments the p+ layer is in contact with a relatively heavily (e.g., $>10^{18}$ cm$^{-3}$) and with a relatively lightly n-doped layer.

Some exemplary embodiments have the following sequences: n+-p+-i-n+; n+-p+-n-n+; n+-i-p+-i-n+; n+-n-p+-i-n+; n+-n-p+-n-n+; n+-n-i-p+-i-n-n+; n+-n-p+-i-n-n+; and n+-i-p+-i-n-n+. By an "i layer" we mean herein a substantially undoped ($\lesssim 10^{15}$/cm$^3$; typically not intentionally doped) layer, by a "n+ layer" or "p+ layer" we mean a layer with dopant concentration $\gtrsim 10^{18}$/cm$^3$, and by a "n layer" we mean a layer with concentration between $10^{15}$ and $10^{18}$/cm$^3$.

All embodiments have the common feature that device properties depend significantly on the details of the acceptor distribution, e.g., height and width of the distribution. Our work strongly suggests that the manufacturing difficulties of prior art devices are related to the difficulty of narrowly controlling the acceptor distribution.

As is well known, the barrier height ($\phi_B$) and capacitance (C) of a diode as shown in FIG. 1 are functions of the acceptor charge density ($Q_A$) and layer thicknesses $d_1$ and $d_2$, as follows:

$$\phi_B = (Q_A \epsilon^{-1})[d_1 d_2/(d_1+d_2)],$$

and $$C = \epsilon A (d_1 + d_2)^{-1};$$

wherein A is the device area, and $\epsilon$ is the dielectric permittivity of the semiconductor material. As can be seen, such a diode can have low barrier height (e.g., less than 0.25 volt, exemplarily 0.1–0.15 volt). Such diodes are, inter alia, useful for, e.g., zero bias applications.

We fabricated PDB diodes substantially as shown in FIG. 1 by a process that involved epitaxial GaAs growth by molecular beam epitaxy. Initially, Be and Si were used for p and n dopants, respectively, and the growth temperature was 600° C. These devices were found to be unreliable, and to degrade under conventional processing (e.g., thermal compression bonding and capping assembly procedures). Lowering the growth temperature to 500° C. did not eliminate the degradation problems. Analysis of the devices revealed Be diffusion into the neighboring intrinsic layer, despite the fact that all relevant processing temperatures were below 620° C. We currently believe that this unexpected diffusion of Be is a cause of the manufacturing problems frequently encountered with prior art PDB diodes.

Subsequently, we fabricated PDB diodes that differed from the Be-doped devices only with regard to the nature of the dopant, replacing Be by C. The resulting diodes according to the invention were found to be highly reliable, and readily manufacturable. For more detail see our paper (Y. Anand et al., Proceedings of the IEEE GaAs Reliability Workshop, Miami Beach, Fla. Oct. 4, 1992, Paper IV-4), incorporated herein by reference.

EXAMPLE 1

On a conventional n+ GaAs substrate are grown (MBE, 600° C.) in sequence: a 0.5 μm n+-GaAs buffer layer ($5 \times 10^{18}$ cm$^{-3}$ Si doped); a 0.2 μm i-GaAs layer (nominally undoped); a 2.5 nm p+-GaAs layer ($5 \times 10^{18}$ cm$^{-3}$ C); a 10 nm i-GaAs layer (nominally undoped); and 0.3 μm n+-GaAs ($5 \times 10^{18}$ cm$^{-3}$ Si) layer. The carbon was sublimated from a heated graphite source, substantially as described in U.S. Pat. No. 5,106,766. Subsequently, the substrate was thinned from the rear to approximately 100 μm, a conventional Ni/Au/Ge/Au layer evaporated onto the back side of the wafer and heated to 420° C. for 30 seconds to form an ohmic contact. Mesa structures were formed by conventional photolithography and etching, with etching through the epitaxial layers into the substrate. A circular aperture was defined in photoresist on the top of each mesa, Ni/Au/Ge/Au was evaporated and lifted off, followed by heating to 420° C. for 30 seconds, resulting in top ohmic contacts. Individual chip die were cut from the wafer and soldered into a conventional microwave packages, the top contact was wire bonded to the packages, which were then hermetically sealed. Subsequent tests showed that substantially all of the thus produced diodes met conventional performance specifications, including reliability specifications. This is to be compared with diodes that were produced as described above, except that Be was used instead of C, and which were found to be unreliable and to degrade during packaging.

EXAMPLE 2

Diodes are made substantially as described in Example 1, except that on the top n+-GaAs layer is deposited a n+-InGaAs layer (50 nm, $1 \times 10^{19}$ cm$^{-3}$ Si doped), and that instead of the top Ni/Au/Ge/Au layer a high temperature refractory metallization layer (WSi$_x$; other possible materials are (TiW) Si$_x$ and Ti/Pt/Au) is deposited, resulting in a non-alloyed top contact. Such a contact can result in improved power handling capability, and can further improve diode reliability.

EXAMPLE 3

Diodes are made substantially as described in Example 1, except that mesas are not etched, but instead the top metalization is used as a mask for O+ ion implantation isolation of the top conducting layers. Other ions (e.g., B+, H+) could also be used, either separately or in combination, typically using multiple implant energies.

We claim:

1. An article comprising a GaAs-based semiconductor diode comprising:
   a) a first and a second planar semiconductor region, with each of the first and second regions comprising n-doped semiconductor material;
   b) a p-doped planar third semiconductor region between said first and second regions, said third region being of thickness t; and
   c) means for electrically contacting said first and second regions such that an electrical bias can be applied between said first and second regions; wherein
   d) t is selected such that, at room temperature and with zero applied bias, said third semiconductor region is substantially depleted of holes; and wherein the dopant in the third semiconductor region essentially is carbon.

2. Article according to claim 1, wherein at least one of said first and second regions comprises a substantially undoped semiconductor layer in contact with said third region.

3. Article according to claim 2, wherein each of said first and second region comprises a substantially undoped semiconductor layer of thickness $d_1$ and $d_2$, respectively, in contact with said third region.

4. Article according to claim 3, wherein $d_1$, $d_2$ and the dopant concentration in said third region are selected such that associated with the unbiased diode is a potential barrier height of less than 0.25 V.

5. Article according to claim 1, wherein at least one of said first and second regions comprises a lightly doped semiconductor layer in contact with said third region.

6. Article according to claim 5, wherein each of said first and second regions comprises a lightly doped semiconductor layer of thickness $d_1$ and $d_2$, respectively, in contact with said third region.

7. Article according to claim 6, wherein the dopant concentration in each of said two lightly doped semiconductor layers is in the range $0.1-1\times10^{17}/cm^3$, and wherein $d_1$, $d_2$ and the dopant concentration in said third region are selected such that associated with the unbiased diode is a potential barrier height of less than 0.25 V.

8. Article according to claim 1, wherein t is in the range 0.3–30 nm, and wherein the dopant concentration in the third region is substantially constant throughout the third region.

9. Article according to claim 1, wherein at least one of said means for contacting said first and second semiconductor regions comprises material selected from the group consisting of $WSi_x$, $(TiW)Si_x$ and Ti/Pt/Au.

10. Article according to claim 1 wherein
A) one of said first and second regions comprises a $n^+$ layer; in contact with the third region and the other of the first and second regions comprises, in order of increasing distance from the third region:
  i) an i layer and a $n^+$ layer; or
  ii) a n layer and a $n^+$ layer;
B) said one region comprises, in order of increasing distance from the third region, an i layer and a $n^+$ layer; and said other region comprises, in order of increasing distance from the third region:
  i) an i layer and a $n^+$ layer; or
  ii) an i layer, a n layer and a $n^+$ layer;
C) said one region comprises, in the order of increasing distance from the third region, a n layer and a $n^+$ layer; and the other region comprises, in the order of increasing distance from the third region:
  i) an i layer and a $n^+$ layer;
  ii) a n layer and a $n^+$ layer; or
  iii) an i layer, a n layer and a $n^+$ layer; or
D) said one region comprises, in order of increasing distance from the third region, an i layer, a n layer and a $n^+$ layer; and said other region comprises, in order of increasing distance from the third region, an i layer, a n layer and a $n^+$ layer; wherein an "i layer" is a substantially undoped (dopant concentration $\lesssim 10^{15}/cm^3$) layer, a "$n^+$ layer" or a "$p^+$ layer with dopant concentration $\gtrsim 10^{18}/cm^3$, and a "n layer" is a layer with donor concentration between $10^{15}$ and $10^{18}/cm^3$.

* * * * *

UNITED STATES PATENT AND TRADEMARK OFFICE
CERTIFICATE OF CORRECTION

PATENT NO.   : 5,329,151
DATED        : July 12, 1994
INVENTOR(S)  : Yoginder Anand, et. al.

It is certified that error appears in the above-indentified patent and that said Letters Patent is hereby corrected as shown below:

Title page, item [73], Assignee:  add M/A-COM, Inc., Lowell, Massachusetts.

Signed and Sealed this

Twenty-sixth Day of September, 1995

Attest:

BRUCE LEHMAN

Attesting Officer

Commissioner of Patents and Trademarks